(12) United States Patent
Dautriche

(10) Patent No.: US 6,304,113 B1
(45) Date of Patent: Oct. 16, 2001

(54) DEVICE FOR SYNCHRONIZING A REFERENCE EVENT OF AN ANALOG SIGNAL ON A CLOCK

(75) Inventor: Pierre Dautriche, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/627,272

(22) Filed: Jul. 28, 2000

(30) Foreign Application Priority Data

Jul. 30, 1999 (FR) .................................................. 99 10089

(51) Int. Cl.⁷ ........................................................ H03L 7/00
(52) U.S. Cl. .............................................. 327/141; 375/362
(58) Field of Search .................................... 327/141, 145, 327/147, 156, 159, 162; 331/17, 25, 40, 60, DIG. 2; 375/355, 356, 362, 364

(56) References Cited

U.S. PATENT DOCUMENTS

| | | | |
|---|---|---|---|
| 5,553,104 | 9/1996 | Takashi et al. | 375/373 |
| 5,646,968 | 7/1997 | Kovacs et al. | 375/375 |
| 5,838,738 | * 11/1998 | Zook | 375/340 |
| 5,978,425 | * 11/1999 | Takla | 375/374 |

FOREIGN PATENT DOCUMENTS

| | | |
|---|---|---|
| 0 680 170 | 11/1995 | (EP) . |
| 2 310 772 | 9/1997 | (GB) . |

OTHER PUBLICATIONS

Batruni, Roy et al., "Mixed Digital/Analog Signal Processing for a Single–Chip 2B1Q U–Interface Transceiver," *IEEE Journal of Solid–State Circuits*, 25(6):1414–1425, 1990.

* cited by examiner

Primary Examiner—Timothy P. Callahan
Assistant Examiner—An T. Luu
(74) *Attorney, Agent, or Firm*—Theodore E. Galanthay; E. Russell Tarleton; Seed IP Law Group PLLC

(57) ABSTRACT

A device for synchronizing a reference event of an analog signal, which includes an analog-to-digital converter receiving an input signal, a register receiving the converter output, a phase-locked loop including an oscillator generating several phase-shifted clock signals of same period, a first clock signal clocking the register, a multiplexer receiving the other clock signals on respective inputs, the output of which clocks said converter, and an analysis circuit connected to control the multiplexer according to successive values of the register output.

20 Claims, 4 Drawing Sheets ized digital samples of the analog signal. A synchroni-
DEVICE FOR SYNCHRONIZING A REFERENCE EVENT OF AN ANALOG SIGNAL ON A CLOCK

TECHNICAL FIELD

The present invention relates to a device for synchronizing analog signals, and, more particularly, to several of these devices associated with several respective analog signals to coordinate the reference events of the signals.

BACKGROUND OF THE INVENTION

FIG. 1 schematically shows a conventional device for synchronizing a reference event of an analog signal. Generally, the device is further provided to convert the synchronized analog signal into a digital signal.

A programmable delay line 1 receives an analog signal DLI1, and provides a delayed analog signal DLO1 to an analog-to-digital converter 3. Analog-to-digital converter 3 provides digital samples D1 at the rate of a clock signal CK0 generated by a phase-locked loop 5. A programmable delay line 2 receives an analog signal DLI2 and provides a delayed analog signal DLO2 to an analog-to-digital converter 4. Analog-to-digital converter 4 provides digital samples D2 at the rate of clock signal CK0. Delay lines 1 and 2 are respectively programmed by control signals COM(Δ) and COM(Δ') generated by a control signal 7 according to signals DLI1 and DLI2.

In an example, the reference event is a zero crossing of the signal. Control circuit 7 is then provided to set delay lines 1 and 2 so that the zero crossing of signal DLI1 is synchronized on the zero crossing of signal DLI2.

FIGS. 2A to 2D illustrate the operation of the device of FIG. 1. FIG. 2A shows a periodic analog signal DLI that transits through 0 at a time t0' advanced by a duration A with respect to a reference time t0.

FIG. 2B shows signal DLI2. Signal DLI2 transits through zero at time t0 delayed by a duration a with respect to reference time t0.

FIG. 2C shows clock signal CK0 generated by phase-locked loop 5. Reference time to is arbitrarily determined by a rising edge of clock signal CK0.

FIG. 2D shows two sequences of digital values ANO1 and AN02 sampled at the respective rising edges of signal CK0.

Control circuit 7 varies delays Δ and Δ introduced by the delay lines between signals DLO1 and DLO2 until the delay between the 0 crossing of signal DLO1 and of signal DLO2 is zero, or the smallest possible, according to what is enabled by the pitch of the delay line.

Although a circuit such as that in FIG. 1 operates satisfactorily, it has significant disadvantages. In particular, a digital circuit including a programmable analog delay line can only be formed in a BICMOS technology, which is expensive.

The features of a delay line, and especially its pitch, can considerably change if the manufacturing process changes. These feature variations are not desirable.

Further, an analog delay line is a delicate element, any modification of which must be performed with the utmost care. This element is said to be uneasily portable from one integrated circuit manufacturing technology to another.

Finally, current techniques do not enable obtaining programmable delay lines having a pitch smaller than an order of one nanosecond.

SUMMARY OF THE INVENTION

The disclosed embodiments of the present invention provide a device for synchronizing a reference event of several analog signals, which can be made in a CMOS technology. Hence, the characteristics of which do not vary according to the manufacturing method.

Such a synchronization device is easily portable from one integrated circuit technology to another. In addition, the synchronization device has a pitch smaller than one nanosecond.

An embodiment of the present invention provide a device for synchronizing a reference event of an analog signal, which includes:

an analog-to-digital converter receiving an input signal, a register receiving the converter output, a phase-locked loop including an oscillator generating several phase-shifted clock signals of same period, a first clock signal clocking the register, a multiplexer receiving the other clock signals on respective inputs, the output of which clocks said converter, and an analysis circuit connected to control the multiplexer according to successive values of the register output.

According to an embodiment of the present invention, the oscillator includes an even number of balanced differential amplifiers connected in an oscillating ring, an output of an amplifier of odd rank providing the first clock signal, and the outputs of the amplifiers of even rank providing said other clock signals.

According to another embodiment of the present invention, the analysis circuit includes a memory for storing the successive values of the register, and a microprocessor for analyzing the successive values to determine the zero crossing times of the output signal of the register.

According to a further embodiment of the present invention, a circuit including several synchronization devices such as previously described is provided, using a single phase-locked loop and the same clock signals.

According to yet another embodiment of the present invention, a circuit for controlling a laser disk reader such as previously described is provided, in which each synchronization device receives an analog signal coming from a pick-up of the disk.

The foregoing features and advantages of the present invention, will be discussed in detail in the following non-limiting description of specific embodiments in connection with the accompanying drawings.

DETAILED DESCRIPTION OF THE INVENTION

The present invention exploits the presence of an analog-to-digital converter to achieve its aim. Instead of delaying an analog signal by means of a programmable analog delay line, the analog signal is immediately converted into digital.

The programmable delay is obtained by means of the analog-to-digital converter that is clocked by a programmable phase clock signal. The output of the analog-to-digital converter is resynchronized on a general clock by a register receiving the converter output.

Figure 1:
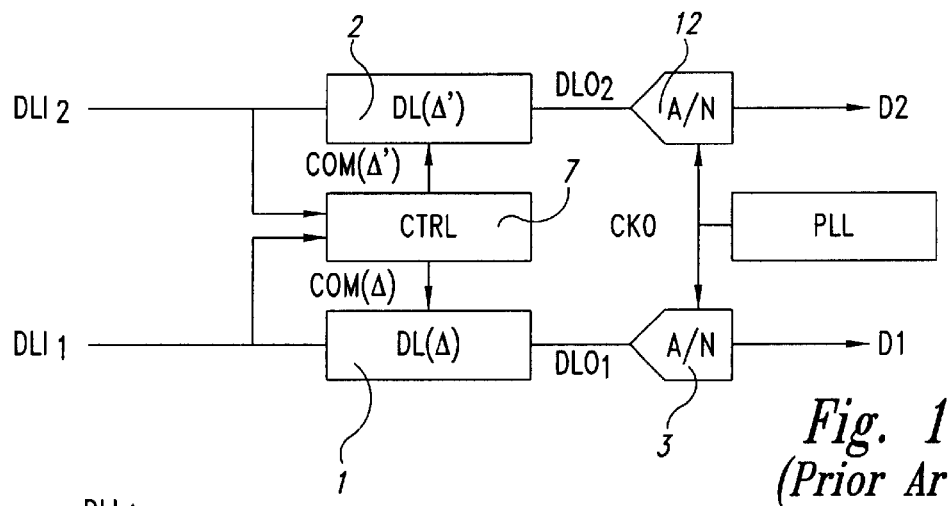
FIG. 1, previously described, shows a synchronization device according to the state of the art.
Figure 2A:
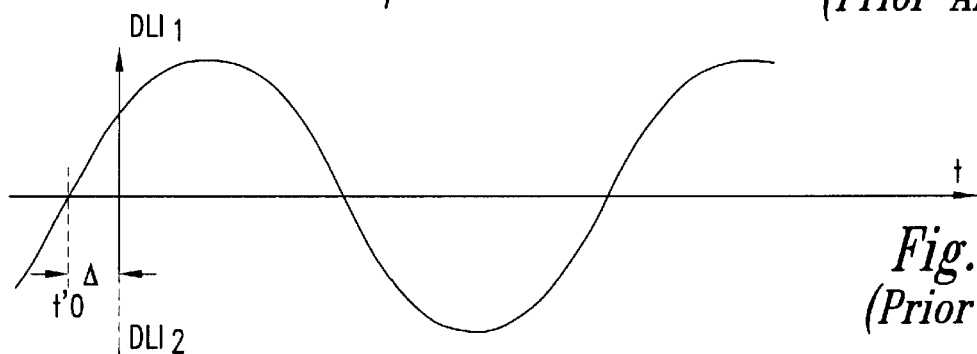
FIGS. 2A to 2D, previously described, illustrate the operation of the device of FIG. 1.
Figure 2B:
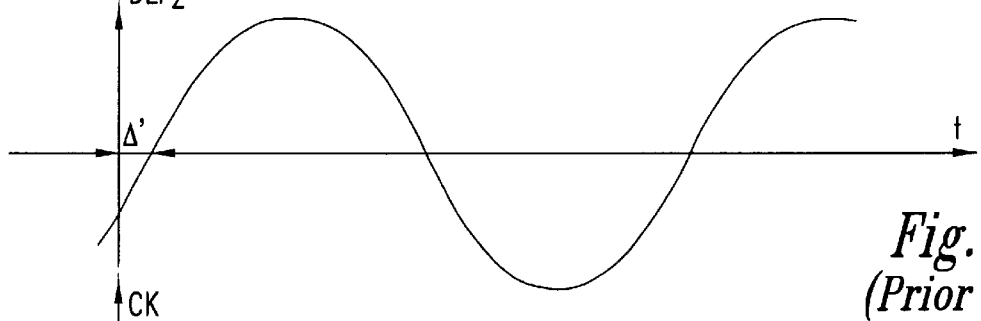
Figure 2C:
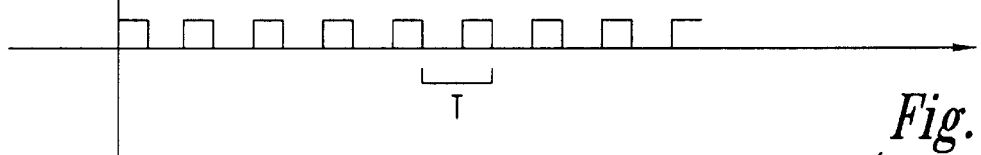
Figure 2D:
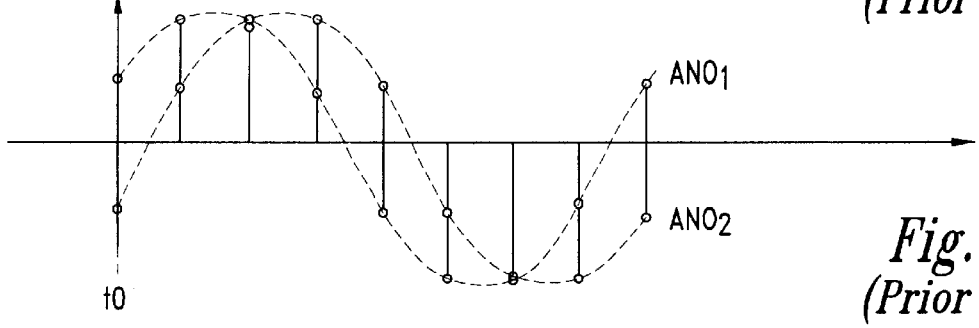
Figure 3:
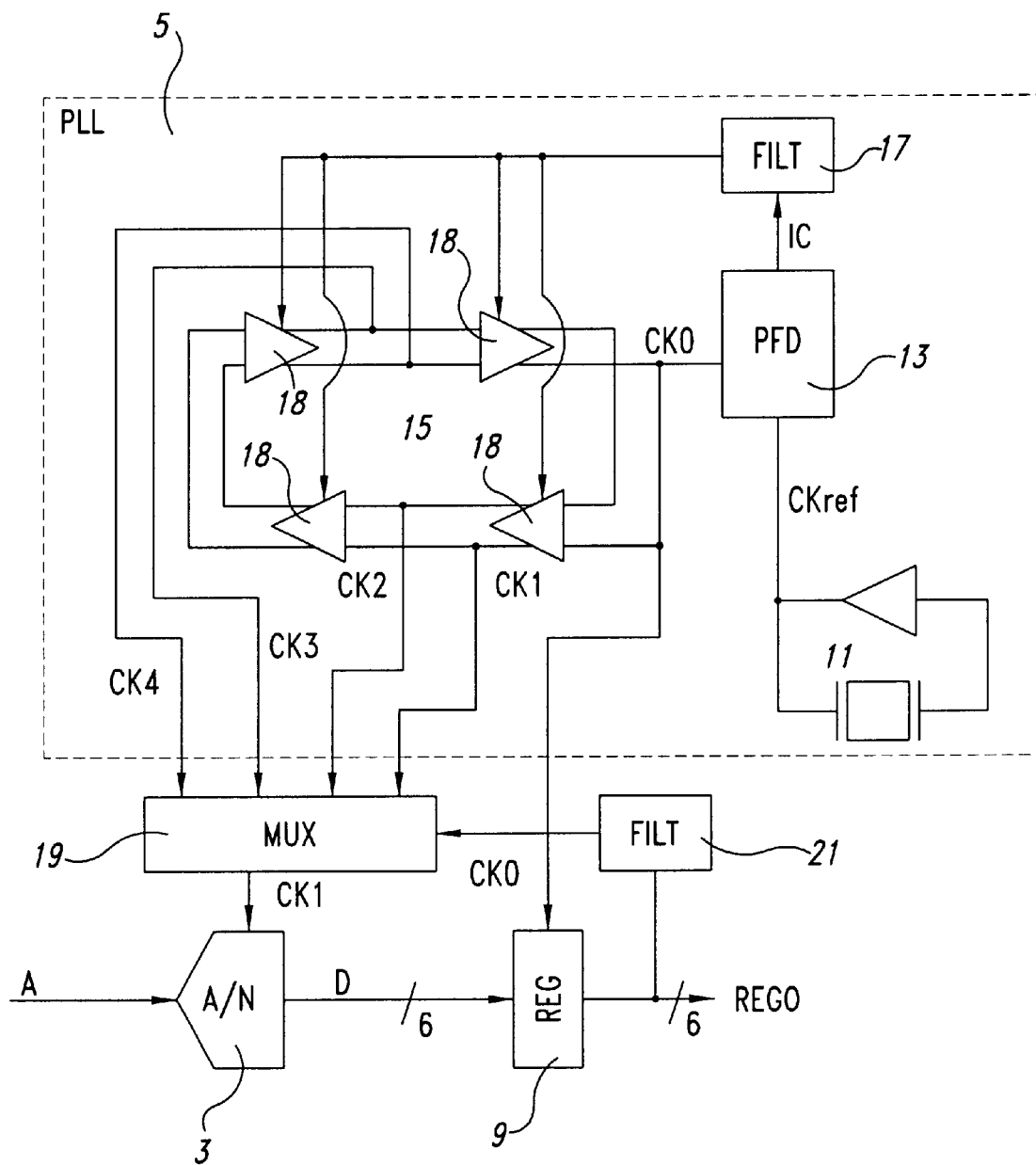
FIG. 3 shows a synchronization device according to the present invention.

FIG. 3 schematically shows a synchronization device according to the present invention, including an analog-to-digital converter 3 that receives a periodic analog signal A and that provides a digital signal D to a register 9. A phase-locked loop 5 includes an oscillator 11 providing a reference clock Ckref. Phase-locked loop 5 further includes a phase comparator 13, the output IC of which controls an oscillator 15 via a low-pass filter 17. Comparator 13 is connected to compare the phases of reference clock Ckref and of a first clock signal CK0 generated by oscillator 15. Register 9 is clocked by clock signal CK0.

Oscillator 15 includes four balanced differential amplifiers 18 connected in an oscillating ring. An output of an amplifier of odd rank generates first clock signal CK0. Clock signals CK1 and CK2 are generated by the complementary outputs of the second amplifier of even rank of oscillator 15. Similarly, clock signals CK3 and CK4 are generated by the complementary outputs of the second amplifier of even rank of oscillator 15. Filter 17 controls the supply current of the amplifiers and thus the propagation time of the loop, corresponding to oscillation period T. The four clock signals CK1 to CK4 are provided to a multiplexer 19. Multiplexer 19, the output of which clocks analog-to-digital converter 3, is controlled by an analysis circuit 21 that receives output REG0 of register 9.

Figure 4A:
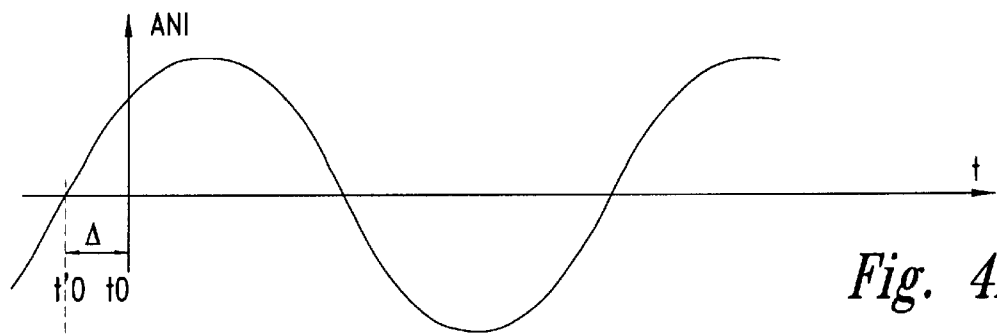
FIGS. 4A to 4D illustrate the operation of the device of FIG. 3.

FIGS. 4A to 4D illustrate the operation of the device of FIG. 3. FIG. 4A shows a periodic analog signal A that transits through 0 at a time t0', with an advance Δ with respect to a reference time t0.

Figure 4B:
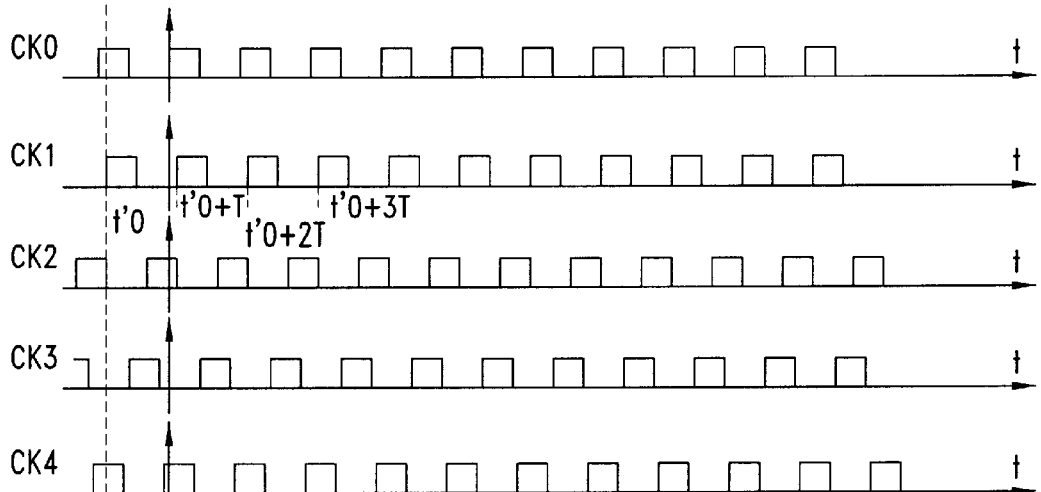

FIG. 4B shows clock signals CK0 to CK4. Time to is defined by a rising edge of first clock signal CK0, period T of which here is longer than duration Δ. Clock signals CK1 and CK3 are phase shifted with respect to each other by one quarter of period T and signal CK1 is shifted by one eighth of period T with respect to clock signal CK0. None of clocks CK1 to CK4 is in phase with clock signal CK0.

Figure 4C:
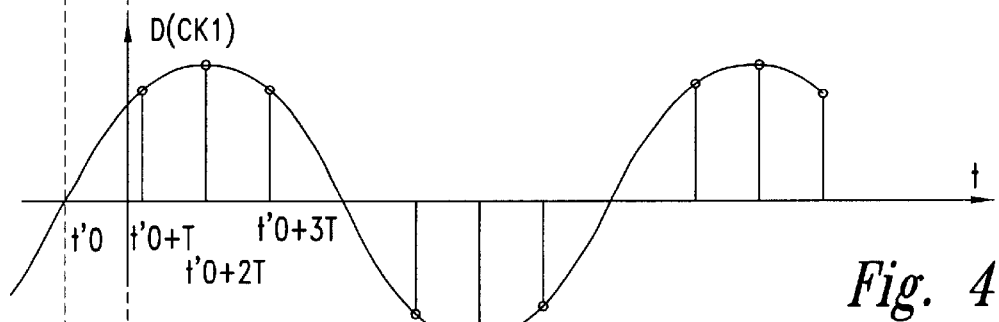

FIG. 4C shows a succession of digital samples D generated by analog-to-digital converter 3, clocked by the successive rising edges of the clock signal provided by multiplexer 19.

Figure 4D:
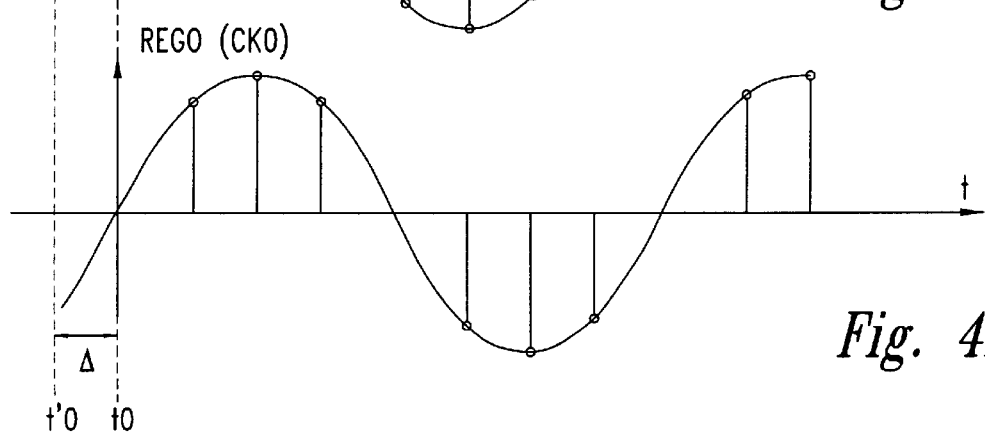

FIG. 4D shows a succession of digital samples D generated by register 9, clocked by the respective rising edges of clock signal CK0. These samples are phase shifted with respect to samples D by the phase difference between clock CK0 and that which is provided by the multiplexer.

Analysis circuit 21 determines, as will be seen hereafter, which one of clock signals CK1 to CK4 has the closest rising edge to time t0' of zero crossing of signal A, and it controls multiplexer 19 to select said signal. In the example shown, it selects signal CK1, a rising edge of which occurs at time t0'. Thus clocked, analog-to-digital converter 3 samples input signal A at times t0', t0'+T, t0'+2T, etc.

At time t0', register 9 receives the value sampled by converter 3, but it only takes it into account at the following rising edge of clock CK0, at time t0. Similarly, the value sampled at time t0'+T by converter 3 is taken into account at a time t0+T by register 9 and so on. As a result, the successive values taken by output REG0 of register 9 effectively correspond to a sampling of analog signal A by clock signal CK0.

For clarity, in the example shown, clock signal CK1 changes exactly at time t0', but it should be noted that it can also change in a time interval equal to the smallest interval between two of clock signals CK1 to CK4, here one quarter of period T. Beyond this time interval, signal CK1 would not be the signal with the closest rising edge to time t0', and analysis circuit 21 would select another clock signal. This introduces an inaccuracy equal to this time interval, which corresponds to the pitch of the present synchronization device.

If another analog signal is desired to be synchronized in a finer way, this pitch can be decreased by increasing the frequency of reference clock signal Ckref or an oscillator 15 including a greater number of balanced differential amplifiers may be provided.

As an example, a device according to the present invention using an oscillator 15 with eight differential amplifiers and a reference clock at 112 MHz enables forming a synchronization device having a pitch of 1.16 nanoseconds. This pitch will be divided by two if sixteen differential amplifiers are used.

If signal A is desired to be delayed by a duration Δ+nT, where n is any integer, it is sufficient to delay signal A by Δ as described hereabove, then to add at the output of register 9 a digital delay line of n stages clocked at period T. It should be noted that the pitch of the synchronization device according to the present invention, equal to T/4 in the discussed example, only depends on frequency 1/T of oscillator 15 of the phase-locked loop. Now, this frequency only depends on the frequency of the reference clock, and not on the device manufacturing method.

The device according to the present invention is only comprised of elements that can be made in CMOS technology and are easy to transpose from one CMOS technology to another, which makes the device particularly portable.

Figure 5:
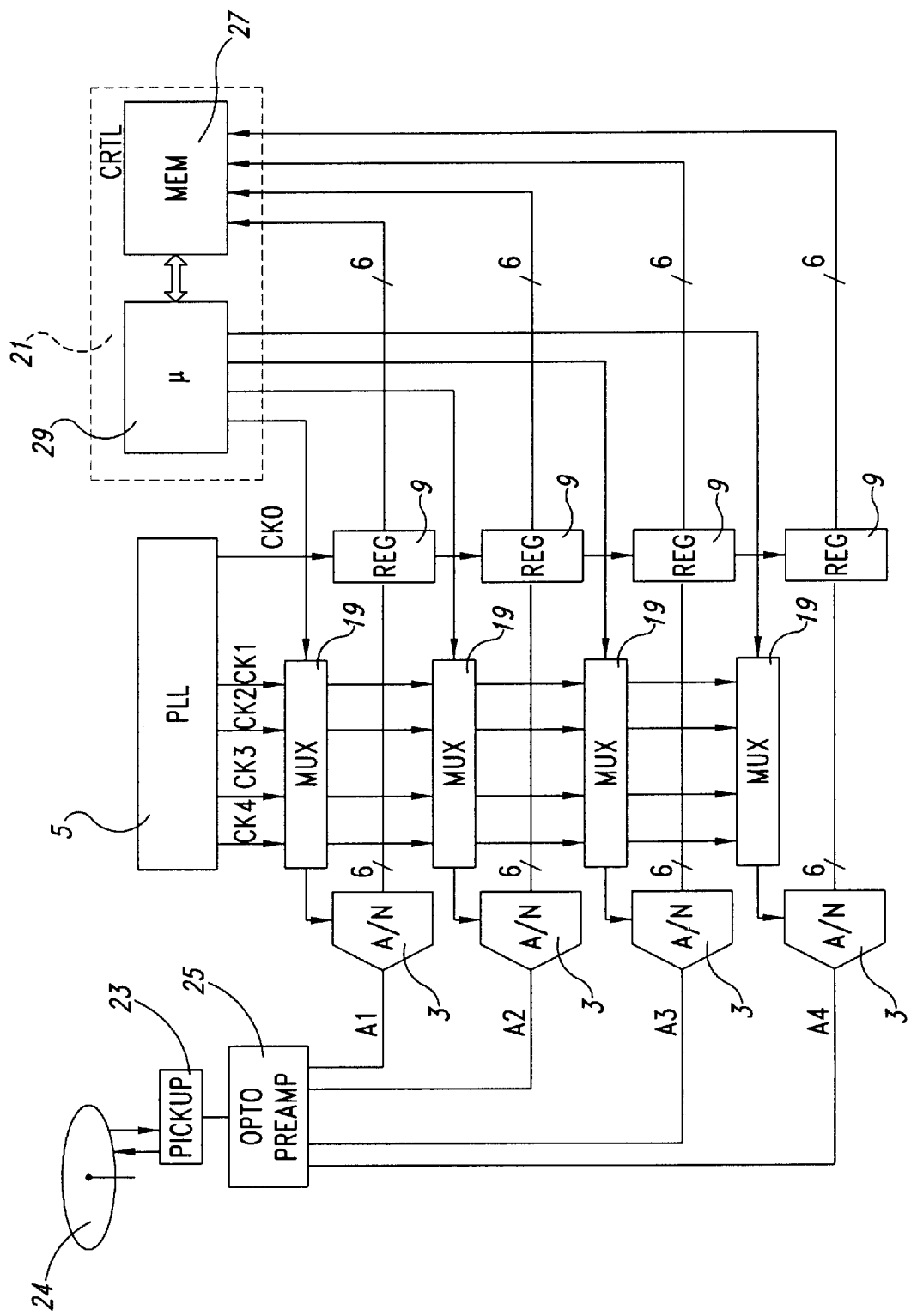
FIG. 5 shows a circuit for processing optical signals, including several synchronization devices according to the present invention.

FIG. 5 shows an architecture of a laser disk reader control circuit including several synchronization devices according to the present invention. Same references designate same elements as in FIG. 3.

Such a circuit for example enables integrating a tracking circuit, conventionally formed in BICMOS technology, in an acquisition/control circuit of the reader, conventionally made in CMOS technology. The tracking circuit receives from the disk pick-up analog centering signals that must be synchronized on a same clock and transmitted in digital form to a microprocessor of the acquisition/control circuit.

In the illustrated example, a pick-up 23 of a laser disk 24 provides four analog signals A1 to A4 to a preamplifier 25. Signals A1 to A4 are provided by preamplifier 25 to four analog-to-digital converters 3. Four multiplexers 19 respectively clock the four analog-to-digital converters 3 and each receives the four phase-shifted clock signals CK1 to CK4 generated by a single phase-locked loop 5. The digital signals generated by the analog-to-digital converters, resynchronized by respective registers 9, are provided to a single analysis circuit 21. Registers 9 are clocked by a general clock CK0 provided by loop 5. Analysis circuit 21 includes a memory 27 in which is stored a table of the digital values generated by registers 9. Memory 27 is connected to a microprocessor 29, which provides a distinct control signal to each of multiplexers 19 according to an analysis of the table. Clock CK0 also clocks microprocessor 29 and memory 27.

Microprocessor 29 uses the table to compute by means of algorithms the 0 crossing time of each of signals A1 to A4. It compares the zero crossing times with the rising edges of clock signals CK1 to CK4, and accordingly controls each multiplexer 19 to select one of these clock signals, so that the zero crossing times of the digital signals coincide with one another.

Of course, the present invention is likely to have various alterations, modifications, and improvements which will readily occur to those skilled in the art. For example, a phase-locked loop only using the outputs of the balanced amplifiers of even rank has been described in FIG. 3, but it is possible to use all the outputs of all the balanced differential amplifiers except for that generating first clock signal CK0. Such an alternative will enable decreasing the pitch of the synchronization device. Further, the timing diagrams of FIGS. 4A to 4D illustrate a case where converter 3 and register 9 are activated by rising edges of the clock signals, but the falling edges may also be used at the cost of minor modifications.

The use of operational amplifiers in the previously-described oscillating ring decreases the jitter of the signals generated by the oscillator by rejecting the common mode noise. However, it should be noted that another type of oscillating ring, using for example an odd number of inverters, may also be used for the oscillator.

Finally, the foregoing description only relates to the synchronization of the zero crossing of an input signal, but the present invention is also applicable to the synchronization of another event, such as the transiting of the input signal through a maximum or minimum value.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for synchronizing a reference event of an analog signal, comprising:
   an analog-to-digital converter receiving an input signal and generating an output,
   a register receiving the converter output,
   a phase-locked loop including an oscillator generating a plurality of phase-shifted clock signals of same period, and generating a first clock signal for clocking the register,
   a multiplexer receiving the plurality of phase-shifted clock signals on respective inputs, an output of which clocks said converter, and
   an analysis circuit coupled to the register and connected to control the multiplexer according to successive values of an output of the register.

2. The synchronization device of claim 1, wherein the oscillator includes an even number of balanced differential amplifiers connected in an oscillating ring, an output of an amplifier of odd rank providing the first clock signal, and the outputs of the amplifiers of even rank providing the plurality of phase-shifted clock signals.

3. The synchronization device of claim 1, wherein the analysis circuit includes a memory for storing successive values of the register, and a microprocessor for analyzing the successive values to determine zero crossing times of the output signal of the register.

4. A circuit, comprising:
   a phase-locked loop including an oscillator configured to generate a plurality of phase-shifted clock signals of the same period and to generate a first clock signal;
   a plurality of synchronization devices, each synchronization device comprising:
      an analog-to-digital converter configured to receive an input signal and to generate an output signal;
      a register configured to receive the output signal from the analog-to-digital converter and to output a value signal;
      a multiplexer configured to receive the plurality of phase-shifted clock signals from the phase-locked loop on respective inputs, and to generate a clocked output that is coupled to the analog-to-digital converter for clocking the analog-to-digital converter; and
      an analysis circuit coupled to the register and connected to the multiplexer to control the multiplexer according to successive values of the value signal output from the register.

5. The circuit of claim 4, wherein the oscillator includes an even number of balanced differential amplifiers connected in an oscillating ring, an output of the amplifier of odd rank providing the first clock signal, and the outputs of the amplifiers of even rank providing the plurality of phase-shifted clock signals.

6. The circuit of claim 4, wherein the analysis circuit includes a memory for storing successive values of the register, and a microprocessor configured to analyze the successive values to determine zero crossing times of the value signal from the register.

7. A circuit for controlling a laser disk reader having a pick-up head generating a plurality of analog signals, the circuit comprising:
   a phase-locked loop including an oscillator configured to generate a plurality of phase-shifted clock signals of the same period and to generate a first clock signal;
   a plurality of synchronization devices, each synchronization device comprising:
      an analog-to-digital converter configured to receive a respective analog signal from a pick-up head of a laser disk reader and to generate an output signal;
      a register configured to receive the output signal from the analog-to-digital converter and to output a value signal;
      a multiplexer configured to receive the plurality of phase-shifted clock signals from the phase-locked loop on respective inputs, and to generate a clocked output that is coupled to the analog-to-digital converter for clocking the analog-to-digital converter; and
      an analysis circuit coupled to the register and connected to the multiplexer to control the multiplexer according to successive values of the value signal output from the register.

8. The circuit of claim 7, wherein the oscillator includes an even number of balanced differential amplifiers connected in an oscillating ring, an output of an amplifier of odd rank providing the first clock signal, and outputs of the amplifiers of even rank providing the plurality of phase-shifted clock signals.

9. The circuit of claim 7, wherein the analysis circuit includes a memory for storing successive values of the register, and a microprocessor configured to analyze the successive values to determine zero crossing times of the value signal from the register.

10. A method for synchronizing a reference event of an analog signal, the method comprising:
   receiving an analog input signal and converting the analog input signal into a digital signal;
   determining a phase shift of the analog input signal;
   selecting one from among a plurality of phase-shifted clock signals that is associated with the determined phase shift of the analog input signal; and
   using the selected phase-shifted clock signal to control the conversion of the analog input signal into the digital signal.

11. The method of claim 10, initially comprising generating a plurality of phase-shifted clock signals.

12. The method of claim 11, wherein the plurality of phase-shifted clock signals have the same period.

13. The method of claim 11, wherein determining the phase shift of the analog input signal comprises analyzing successive values of the digital signal to determine zero crossing times of the digital signal.

14. The method of claim 11, wherein generating a plurality of phase-shifted clock signals further comprises generating a register clock signal; and wherein converting the analog input signal into a digital signal further comprises receiving the digital signal in a register clocked by the register clock signal.

15. The method of claim 14, wherein generating the plurality of phase-shifted clock signals comprises receiving the plurality of phase-shifted clock signals at a multiplexer and selecting one of the plurality of phase-shifted clock signals to control converting the analog input signal.

16. A device for synchronizing a reference event of an analog signal, the device comprising:
an analog-to-digital converter configured to convert a received analog input signal into a digital output signal;
a register adapted to receive the digital output signal from the converter and to generate a register output;
a phase-locked loop configured to generate a plurality of phase-shifted clock signals;
a multiplexer configured to receive the plurality of phase-shifted clock signals on respective inputs and to output a single phase-shifted clock signal for clocking the converter; and
an analysis circuit configured to receive successive values of the register output from the register and to generate a control signal to the multiplexer for selecting one of the plurality of phase-shifted clock signals according to successive values of the register output.

17. The device of claim 16, wherein the phase-locked loop comprises an oscillator configured to generate the plurality of phase-shifted clock signals and to generate the register clock signal.

18. The device of claim 17, wherein the analysis circuit comprises a memory for storing successive values of the register, and a microprocessor configured to analyze the successive values for determining which of the phase-shifted clock signals to select through the multiplexer.

19. The device of claim 18, wherein the microprocessor is configured to analyze the successive values of the register output to determine zero crossing times of the register output.

20. The device of claim 17, wherein the oscillator comprises an even number of balanced differential amplifiers connected in an oscillating ring, an output of an amplifier of odd rank providing the register clock signal, and the outputs of the amplifiers of even rank providing the plurality of phase-shifted clock signals.

* * * * *